(12) United States Patent
Heinke

(10) Patent No.: US 6,721,158 B2
(45) Date of Patent: Apr. 13, 2004

(54) METHOD FOR PROVIDING CURRENT BY MEANS OF AN INDUCTIVE COMPONENT

(75) Inventor: Friedhelm Heinke, Heroldsberg (DE)

(73) Assignee: Conti Temic microelectronic GmbH, Nuremberg (DE)

(*) Notice: Subject to any disclaimer, the term of this patent is extended or adjusted under 35 U.S.C. 154(b) by 0 days.

(21) Appl. No.: 10/168,925

(22) PCT Filed: Dec. 2, 2000

(86) PCT No.: PCT/EP00/12142
§ 371 (c)(1),
(2), (4) Date: Jun. 24, 2002

(87) PCT Pub. No.: WO01/48776
PCT Pub. Date: Jul. 5, 2001

(65) Prior Publication Data
US 2002/0191424 A1 Dec. 19, 2002

(30) Foreign Application Priority Data
Dec. 24, 1999 (DE) .......................... 199 63 154

(51) Int. Cl.⁷ ................................ H01H 47/00
(52) U.S. Cl. .................. 361/152; 361/155; 123/490
(58) Field of Search ................ 361/152, 154, 361/155; 123/490, 478

(56) References Cited

U.S. PATENT DOCUMENTS

| | | | |
|---|---|---|---|
| 4,180,026 A | 12/1979 | Schulzke et al. | |
| 4,314,305 A | 2/1982 | Williams et al. | |
| 4,729,056 A * | 3/1988 | Edwards et al. | 361/153 |
| 5,267,545 A * | 12/1993 | Kitson | 123/490 |
| 5,381,297 A * | 1/1995 | Weber | 361/153 |
| 5,469,825 A * | 11/1995 | Golab et al. | 123/479 |
| 5,711,280 A | 1/1998 | Foerster et al. | |
| 5,717,562 A * | 2/1998 | Antone et al. | 361/155 |
| 5,975,057 A | 11/1999 | Repplinger et al. | |
| 6,031,707 A | 2/2000 | Meyer | |

FOREIGN PATENT DOCUMENTS

| | | |
|---|---|---|
| DE | 2255553 | 7/1973 |
| DE | 2831307 | 2/1979 |
| DE | 3031659 | 5/1981 |
| DE | 3213515 | 10/1983 |
| DE | 3920064 | 1/1991 |
| DE | 19533131 | 3/1997 |

OTHER PUBLICATIONS

Herbert Sax, "Verlustarme Ansteuerung von Aktuatoren Spezial–ICs ersetzen diskrete Schaltungen"; Leistungselektronik, Nov. 1987, pp. 142 to 152; Elektronik, No. 23, Nov. 13, 1987.

* cited by examiner

Primary Examiner—Bao Q. Vo
(74) Attorney, Agent, or Firm—W. F. Fasse; W. G. Fasse

(57) ABSTRACT

There is suggested a simple and cost-economical circuit arrangement for specifying the current through an inductive component, in which the inductive component is acted on by the supply voltage through a switching element. To ensure a rapid and reliable increase of the current in a first phase of the current supply phase, the inductive component is acted on by a constant voltage generated by a constant voltage source during the first phase of the current supply phase, and is acted on by the supply voltage during a subsequent second phase of the current supply phase.

16 Claims, 3 Drawing Sheets

METHOD FOR PROVIDING CURRENT BY MEANS OF AN INDUCTIVE COMPONENT

Figure 1:
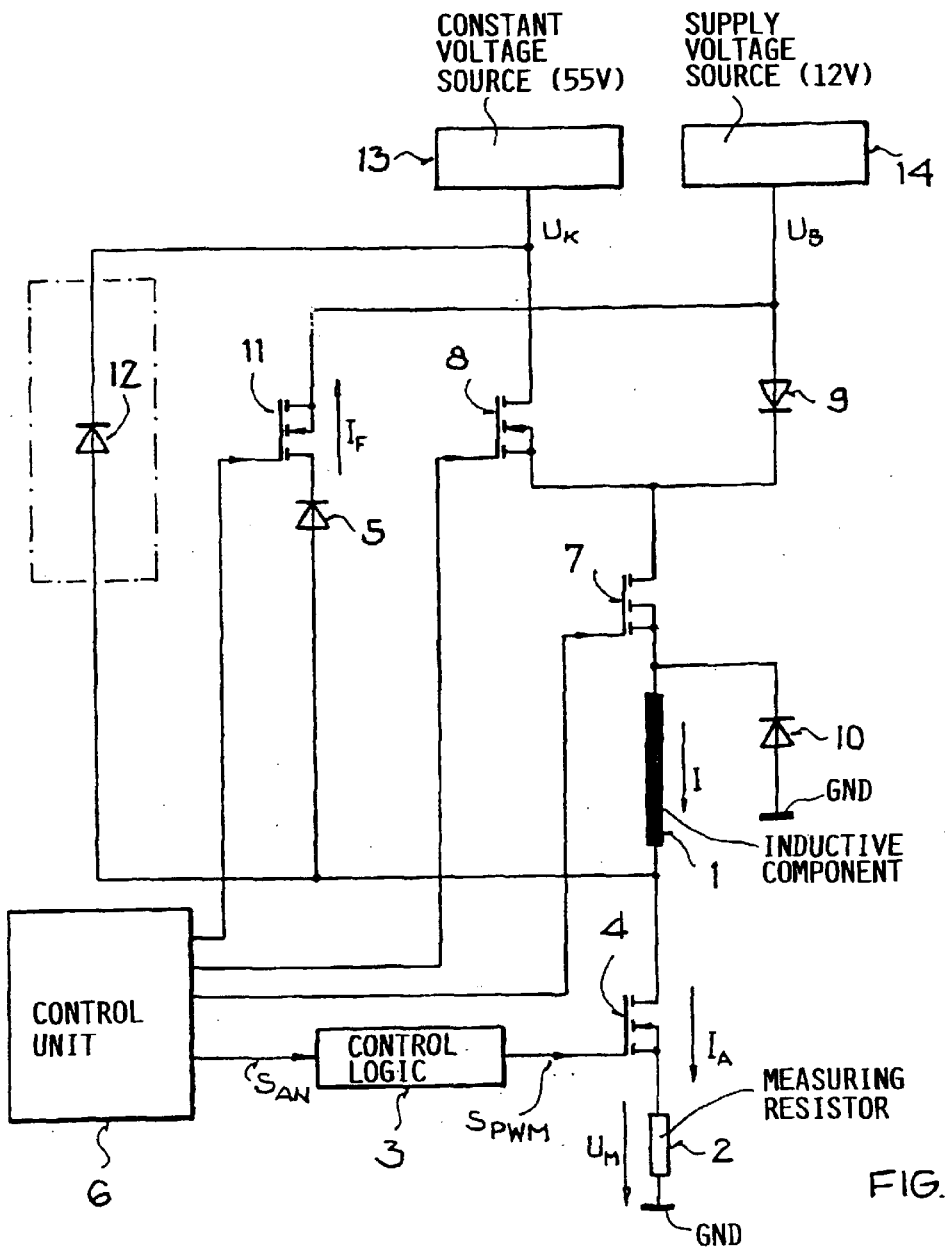

Inductive components, for example inductive actuators, are utilized in many fields of application, for example in the field of motor vehicles in control devices as electropneumatic converters or proportional valves (magnet valves). These inductive components generally consist of an electromagnet (a coil) and a movable armature, whereby the magnetic field strength that is generated with the electromagnet and that moves the armature is proportional to the current through the electromagnet (the coil).

In several application cases it is necessary to impose a certain magnetic flux and therewith a certain magnetic field strength onto the inductive component, which is supplied by means of a supply voltage (operating voltage); for this, a current with a certain prescribed current strength must flow through the inductive component during a current supply phase. Especially in dynamically very rapid applications (for example the injection process of fuel into the combustion engine of a motor vehicle), it is further necessary to provide a rapid activation and deactivation of the current supply phase, that is to say a rapid switching-on and switching-off of the current through the inductive component (of the coil current).

As is described in the DE 195 33 131 A1, for the rapid switching-on of the current through the inductive component, during a first phase (switching-on phase) of the current supply phase, the inductive component can be subjected to or acted on by a higher voltage than the normal supply voltage (operating voltage), so that a switching-on current flows with a high current strength during the switching-on phase.

The object underlying the invention is to suggest a method for prescribing or specifying the current through an inductive component, wherein an advantageous current progression or course can be realized during the current supply phase, especially at the activation of the current supply phase, in a simple and cost-economical manner with a small number of components.

This object is achieved according to the invention by the feature in the characterizing portion of the patent claim 1. Advantageous embodiments of the method arise from the further patent claims.

For realizing the conceived method, two voltage sources with respective different potentials are provided: a supply voltage source for providing a supply voltage with a certain voltage value (for example 12 V) and a constant voltage source (for example a switching network or combinatorial circuit component) for providing a higher voltage value (for example 55 V) than that of the supply voltage. In order that a rapid rise or increase of the current through the inductive component is achieved after the activation of the current supply phase, the constant voltage source is used for the voltage supply of the inductive component during a first phase of the current supply phase (the switching-on phase), and the supply voltage is used for the voltage supply of the inductive component during a second phase of the current supply phase following the first phase (after the switching-on phase). Two switch-over elements connected in series and a blocking element are provided for the alternating connection of both voltage sources with the inductive component. i.e. for the switching-over of the voltage supply between the two voltage sources, whereby the first switch-over element (for example a field effect transistor FET) is connected with the constant voltage source, the blocking element (for example a blocking diode or a field effect transistor FET) is arranged between the connection of the supply voltage and the junction point of the two switch-over elements, and the second switch-over element (for example a field effect transistor FET) is connected with a connection of the inductive component. For the voltage supply of the inductive component, the constant voltage source is activated at least so long until the current flowing through the inductive component reaches a prescribed current threshold value, that is to say the minimum duration of the first phase of the current supply phase is fixedly specified by the current threshold value; optionally the constant voltage source can still also be applied after reaching the current threshold value, in order to ensure a reliable current flow through the inductive component with the desired current strength even with disadvantageous characteristics of the inductive component. During the second phase of the current supply phase, the current strength of the current flowing through the inductive component can be reduced from a first current value (that is to say from the current threshold value) to a second current value; time point, time characteristic, and the respective applicable current values are selected dependent on the characteristics of the inductive component: the first current value (the current threshold value) is thereby selected as a "capture current", so that the armature of the inductive component will be surely "captured" by the electromagnet, the second current value is selected as a "holding current", so that the armature of the inductive component will be surely "held" by the electromagnet; the time characteristic or behavior during the transition from the first current value to the second current value is selected so that the characteristics of the inductive component are optimally utilized or improved, for example the current strength of the current flowing through the inductive component is smoothly or glidingly reduced, for example exponentially reduced, in order to ensure a certain injection characteristic of an injection valve; the time point for the switching-over of the current strength is prescribed in connection with an optimization of the characteristics of the system comprising the inductive component (for example an injection valve).

The temporal control of the current flow through the inductive component, that is to say especially the activation and deactivation of the current supply phase, is carried out by a control unit (for example by a microprocessor). In order that a rapid current decrease or fall-off (rapid switching-off of the inductive component) occurs after the deactivation of the current supply phase, the energy stored in the inductive component during the current supply phase must be rapidly dissipated; for this purpose, a switch-off element (for example a switch-off transistor) arranged between the inductive component and the connection of the supply voltage is provided: this switch-off element can either be switched to a highly resistive state and the energy present in the magnet circuit of the inductive component can be transformed into heat upon the deactivation of the current supply phase, whereby the current decrease or fall-off upon the deactivation of the current supply phase can be influenced by means of the height or level of a clamping voltage; or this switch-off element is opened, and a feedback or return flow of the energy stored in the inductive component back into the constant voltage source is carried out by a feedback element (for example a diode) arranged between the inductive component and the connection of the constant voltage source.

A current measuring device connected with the inductive component can be provided for detecting the current flowing through the inductive component during the current supply phase; with this current measuring device—for example a measuring resistor (shunt), which detects the current flowing through the inductive component during the current supply phase as a measured voltage—the point of reaching the current threshold value (for determining and fixing the minimum duration of the first phase of the current supply phase) can be determined: for this purpose, a certain voltage value is allocated to the current threshold value, whereby this voltage value is compared with the measured voltage determined by the measuring resistor.

The temporal current flow of the current through the inductive component is prescribed by a switching element connected with the inductive component: the activation and deactivation of the current supply phase can be carried out with this switching element; moreover, also the temporal course or progression or the current strength of the current through the inductive component during the current supply phase can be influenced, especially by control activation or driving of the switching element by means of a pulse width modulation (PWM) during the second phase of the current supply phase.

In order to suppress switch-over effects and their consequences on the current flow of the current through the inductive component upon the switching-over of the voltage sources, the pulse width modulation (PWM) can first be activated after a prescribed time interval after the switching-over from the constant voltage to the supply voltage. Hereby also, the reduction of the current strength provided during the second phase of the current supply phase and the time characteristic or behavior in connection with the reduction of the current strength can be prescribed or specified in a simple manner by variation of the pulse duty ratio of the pulse width modulation (PWM).

Advantageously, in the conceived method, a specifying or prescribing of the current through the inductive component is made possible in a simple and cost-economical manner with only a few components, whereby especially a rapid switching-on of the current through the inductive component is made possible; moreover a rapid switching-off of the current through the inductive component and a defined time characteristic or behavior of the current through the inductive component in connection with the switching-on process and in connection with the switching-off process as well as during the current supply phase can be prescribed. As a result of that, the inductive component can be control activated or driven in an optimized manner with respect to time characteristics and power, depending on the application case, and a further operating range with defined (especially constant) characteristics can be specified or established.

Figure 2A:
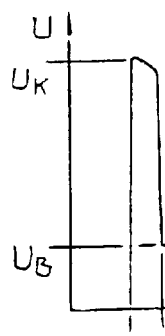
Figure 2B:
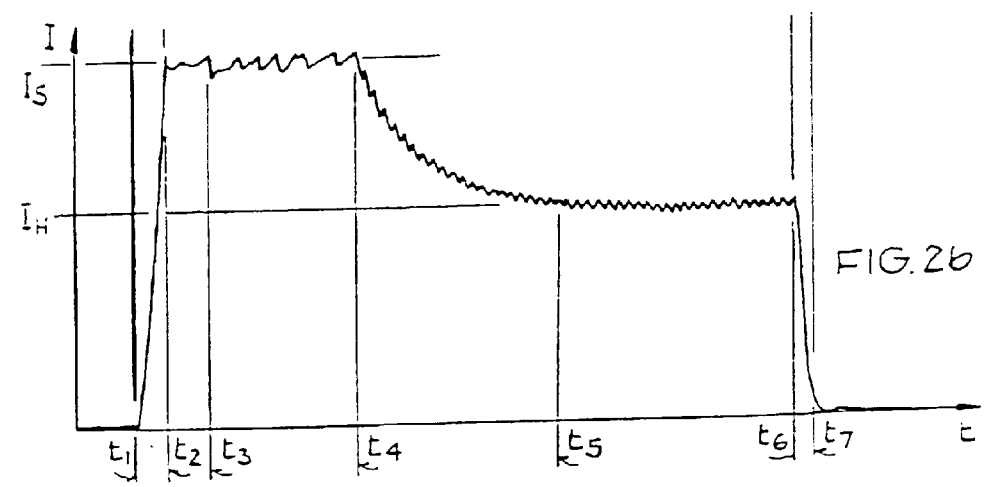
Figure 2C:
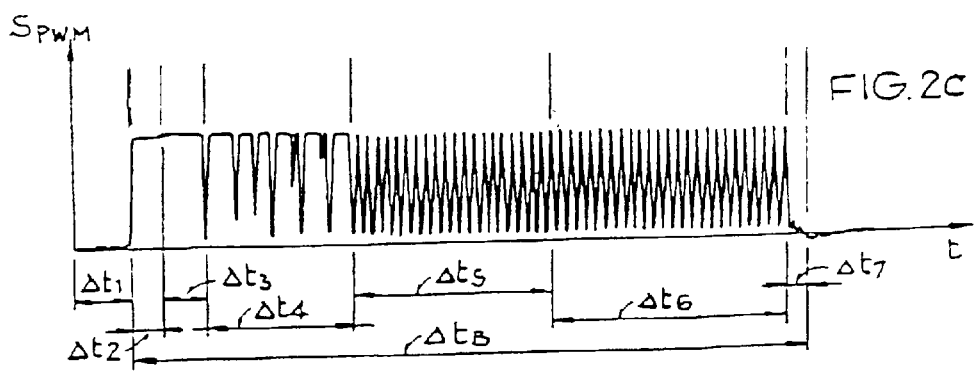
Figure 3A:
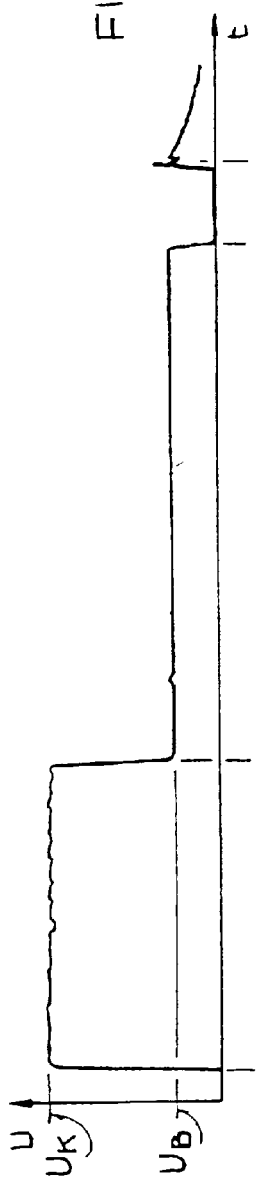
Figure 3B:
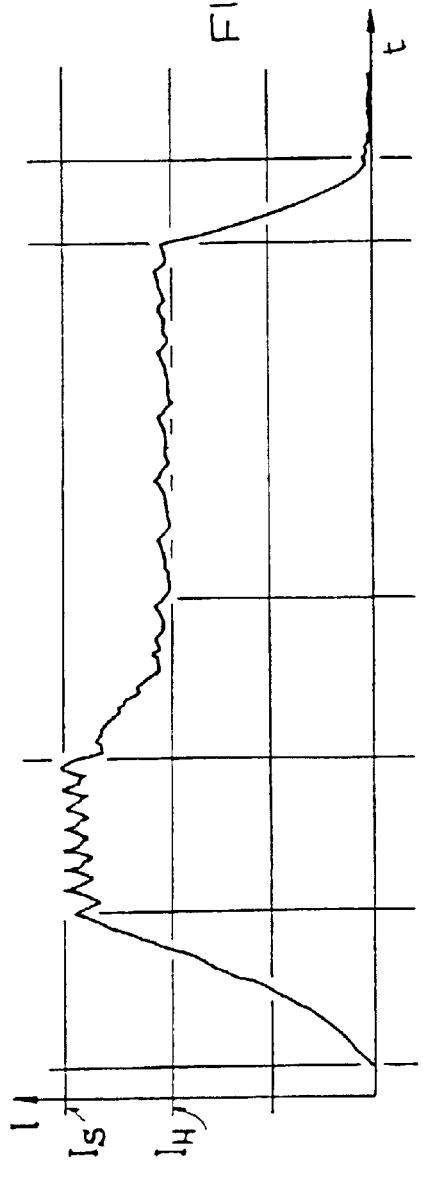
Figure 3C:
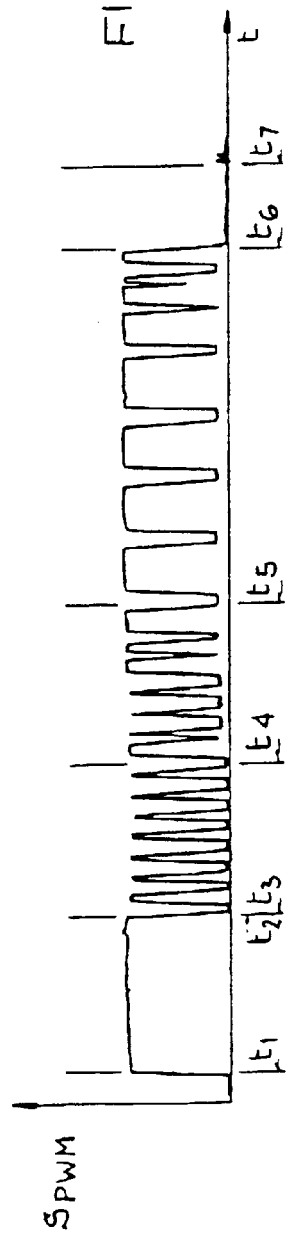

In the following, the invention shall be described in connection with the drawings. Thereby it is shown by:

FIG. 1 the principle circuit diagram of a circuit arrangement for realizing the method for specifying the current through the inductive component, FIG. 2 a time diagram for explaining the functioning and the time progression or course of the method (FIG. 2A time progression of voltage on the coil of the inductive component, FIG. 2B time progression of current, FIG. 2C control activating or driving signal of the PWM), FIG. 3 a further time diagram for explaining the functioning and the time progression or course of the method (FIG. 3A time progression of voltage on the coil of the inductive component, FIG. 3B time progression of current, FIG. 3C control activating or driving signal of the PWM).

According to the principle circuit diagram of FIG. 1, the first connection of the inductive component 1 is connected with the connection of the constant voltage source 13 (for example a switching network or combinatorial circuit component for generating a constant voltage $U_K$ of, for example, 55 V) that generates the constant voltage $U_K$, via a first switch-over element 7 (for example a switch-over transistor embodied as a field effect transistor FET) and a second switch-over element 8 (for example a switch-over transistor embodied as a field effect transistor FET) connected in series to the first switch-over element 7, and the first connection of the inductive component 1 is connected with the connection of the supply voltage source 14 (for example a battery with a supply voltage $U_B$ of, for example, 12 V) that generates the supply voltage $U_B$, via the first switch-over element 7 and a blocking element 9 (for example a blocking diode or a field effect transistor FET) connected in series to the first switch-over element 7. Furthermore, a switch-off diode 10 is connected against reference potential GND at the first connection of the inductive component 1. The control inputs of the two switch-over elements 7, 8 are connected with the control unit 6 and are (synchronously) switched in time by this control unit 6 by means of control signals.

The second connection of the inductive component 1 is connected with a control logic 3, which is subjected to or acted on by a control actuating or driving signal $S_{AN}$ from the control unit 6, for the purpose of connecting the inductive component 1 with one of the two voltage sources 13, 14 and for separating the inductive component 1 from the two voltage sources 13, 14 and therewith for prescribing the current flow I through the inductive component 1 via the switching element 4 (for example a control activating or driving transistor embodied as a field effect transistor FET); the control activating or driving signal $S_{AN}$ serves for the activation and deactivation of the current supply phase, and therewith of the current flow I through the inductive component 1. By means of the control logic 3, a PWM signal $S_{PWM}$ for realizing variable currents I through the inductive component 1 and therewith variable magnetic field strengths during the second phase of the current supply phase is generated by means of pulse width modulation (PWM) (control activating or driving phase with the activating or driving current $I_A$). Moreover, for maintaining a current flow during the free running phase (free running current $I_F$), there is connected to the second connection of the inductive component 1, a free running circuit of the free running diode 5 and the switch-off element 11 (for example a switch-off transistor embodied as a field effect transistor FET), which is driven by the control unit 6, leading to the supply voltage source 14, and a feedback diode 12 leading to the constant voltage source 13. Moreover, a measuring resistor 2 (shunt) is connected with respect to reference potential (GND) at the second connection of the inductive component 1; the voltage $U_M$ on the measuring resistor 2 is a measure for the current I flowing through the inductive component 1.

In the time diagram of the FIG. 2, the time course or progression of the voltage U on the coil of the inductive component 1 (FIG. 2A), the time progression of the current I through the inductive component 1 (FIG. 2B) and the control actuating or driving of the current flow during the current supply phase ΔtB through the pulse width modulation signal $S_{PWM}$ (FIG. 2C) are illustrated.

Up to the time point t1 (in the time interval Δt1), the current flow through the inductive component 1 is deactivated by the control unit 6 (deactivation of the current supply phase ΔtB); the switching transistor 4 is blocked by the control actuating or driving signal $S_{AN}$ and the switch-over transistor 7 is blocked by the control unit 6, whereby the inductive component 1 is separated from the voltages sources 13, 14, that is to say, in the time interval Δt1, no voltage U is being applied and no current I flows through the inductive component 1.

At the time point t1, the current flow through the inductive component 1 is activated by the control unit 6 (activation of the current supply phase ΔtB); the switching transistor 4 becomes conductive by means of the control actuating signal $S_{An}$, and thereby connects the inductive component 1 with one of the two voltage sources 13, 14, that is to say, at the time point t1 a voltage U is applied to the inductive component 1, and a current I begins to flow through the inductive component 1.

In the time interval Δt2 (time point t1 until time point t2), that is to say in the first phase of the current supply phase ΔtB (switch-on phase), a rapid increase or rise of the current flow through the inductive component 1 is to be achieved; for this purpose, both switch-over transistors 7, 8 are closed by switching signals of the control unit 6, whereby the inductive component 1 is connected with the constant voltage source 13 (the blocking diode 9 is blocked, since the constant voltage $U_K$ of the constant voltage source 13 is greater than the supply voltage $U_B$ of the supply voltage source 14, that is to say, in the time interval Δt2, the constant voltage $U_K$ is applied to the inductive component 1, and a current I having a high increase rate or rise rate dI/dt and a current strength dependent on the constant voltage $U_K$ flows through the inductive component 1.

At the time point t2, the current threshold value $I_S$ is reached by the current I (end of the first phase of the current supply phase ΔtB, beginning of the second phase of the current supply phase ΔtB); by corresponding switching signals of the control unit 6, the switch-over transistor 8 is opened, while the switch-over transistor 7 remains closed, whereby the inductive component 1 is connected with the supply voltage source 14 and thereby is subjected to or acted on by the supply voltage $U_B$ (the blocking diode 9 is conductive), that is to say, in the time interval Δt3 (time point t2 until time point t3), the supply voltage $U_B$ is applied to the inductive component 1, and a current I with a current strength dependent on the supply voltage $U_B$ flows through the inductive component 1.

At the time point t3 (after the completion or lapse of the time interval Δt3 provided for screening out switch-over effects on the inductive component 1 in connection with switching-over of the voltage sources 13, 14), the PWM is activated by the control unit 6 with a closed switch-over transistor 7: according to the FIG. 2C, the switching element 4 is subjected to or acted on by the PWM signal $S_{PWM}$ embodied as a square wave signal by the control logic 3, whereby the PWM signal $S_{PWM}$ has a certain control actuating or driving frequency and a prescribable pulse duty ratio (ratio of the pulse duration relative to the pulse pause or of the pulse duration relative to the period duration of the actuating or driving period), and hereby the inductive component 1 is provided with current in a variably clocked or cycled manner. By means of the pre-specification or pre-specified supplying of the pulse duty ratio (for example by a current regulation), the current flow through the inductive component 1 is adjustingly set: during the pulse duration (control actuating or driving phase) the switching element 4 is closed and the inductive component 1 is subjected to or acted on by the supply voltage $U_B$ through the switch-over transistor 7 and the conducting blocking diode 9, so that the control actuating or driving current $I_A$ flows in the actuating or driving circuit through the inductive component 1 and the measuring resistor 2; during the pulse pause (free running phase), the switching element 4 is open and the inductive component 1 is separated from the supply voltage $U_B$, so that the free-running current $I_F$ continues to flow on further in the free running circuit through the free-running diode 5 (decoupling diode) and the closed switch-off element 11 (the switch-off transistor) via the conducting blocking diode 9 and the switch-over transistor 7, and hereby the energy is left remaining in the magnet circuit (the exponential current decrease or fall-off during the respective free-running phase arises from the ohmic resistances of the current circuit).

At the time point t4 (after completion or lapse of the time interval Δt4 provided for the sure "capture" of the armature of the inductive component 1), the current I through the inductive component 1 is reduced from the current threshold value $I_S$ (capture current) to the holding current $I_H$; this reduction of the current I is realized by a variation of the pulse duty ratio of the PWM, whereby this variation of the pulse duty ratio occurs in a smoothly gliding manner in the time interval Δt5 (time point t4 until time point t5).

In the time interval Δt6 (time point t5 until time point t6) the holding current $I_H$ is set or prescribed as the current strength of the current I through the inductive component 1, that is to say the pulse duty ratio of the PWM is adjusted and set so that the holding current $I_H$ arises as the average current flow during the actuating or driving phase and the free-running phase.

At the time point t6 (after completion or lapse of the time interval t6), the current flow through the inductive component 1 is deactivated by the control unit 6 (deactivation of the current supply phase ΔtB); the switching transistor 4 is blocked (opened) by the actuating or driving signal $S_{AM}$, the switch-over transistor 7 is opened by corresponding switching signals of the control unit 6 (the switch-over transistor 8 is already opened), whereby the inductive component 1 is separated from the supply voltage source 14 (from the supply voltage $U_B$) and from the constant voltage source 13 (from the constant voltage $U_K$), that is to say the voltage U on the inductive component 1 becomes negative due to induction effects. In order to achieve a rapid decrease or fall-off of the current flow through the inductive component 1, the switch-off transistor 11 can be differently activated or driven: if the switch-off transistor 11 is brought into the highly resistive condition, then a current flow is maintained through the switch-off diode 10, the free-running diode 5 and the switch-off transistor 11, whereby the switch-off transistor 11 is only driven through [to be partially conductive] to such an extent until a desired clamping voltage is achieved on the inductive component 1—the energy stored in the inductive component 1 is thereby transformed into heat in the switch-off transistor 11 (a small portion of the energy is fed back into the supply voltage source 14), whereby the current decrease or fall-off (the time characteristic behavior of the current fall-off) can be influenced via the height or level of the clamping voltage; if instead the switch-off transistor 11 is (completely) opened, then the voltage on the inductive component 1 will increase so long until the inductive component 1 acts as a voltage source—the current flow is maintained through the switch-off diode 10 and the feedback diode 12, so that a feedback into the constant voltage source 13 (higher voltage) is made possible.

At the time point t7 (after completion or lapse of the time interval Δt7), the entire energy stored in the inductive component 1 is dissipated and the switch-off phase (deactivation of the current supply phase) is ended.

According to a first example embodiment, an inductive component 1 which is, for example, embodied as a magnet valve of a motor vehicle and provided as an injection valve for the diesel direct injection ("common rail"), is supplied, for example, with a battery voltage supplied by a battery 14 as a supply voltage $U_B$ of, for example, 13.5 V. As an alternative voltage source, a constant voltage source 13 is provided, which makes available a constant voltage $U_K$ of, for example, 55 V. For example, a current flow I through the inductive component is prescribed during a current supply phase ΔtB (time point t1 until time point t7) of, for example, 1 ms. After the activation of the current supply phase ΔtB (time point t1), the current threshold value $I_S$ of, for example, 16 amps, is reached after, for example, 50 μs, that is to say, the current I through the inductive component 1 increases or rises with a rate of approximately 0.3 A/μs. After a time duration Δt3+Δt4 of, for example, 380 μs, the current I through the inductive component 1 is reduced from the capture current $I_S$ to the holding $I_H$, for example a capture current $I_S$ of 16 A and a holding current $I_H$ of 9 A is allocated to the inductive component 1, whereby the reduction of the current strength I, for example, occurs through a smoothly gliding reduction of the pulse duty ratio of the PWM as the ratio of the pulse duration relative to the period duration in a time interval Δt5 of, for example, 250 μs.

In the time diagram of FIG. 3, a time progression of the voltage U on the coil of the inductive component 1 (FIG. 3A), which is modified relative to the FIG. 2, is prescribed. Furthermore, as in the FIG. 2, the time progression of the current I through the inductive component 1 (FIG. 3B) and the control activation or driving of the current flow during the current supply phase by means of the pulse width modulation signal $S_{PWM}$ (FIG. 3C) are illustrated. Until the time point t1, the current flow through the inductive component 1 is deactivated by the control unit 6 (deactivation of the current supply phase ΔtB). From the time point t1 until the time point t2, a rapid increase or rise of the current flow through the inductive component 1 is achieved, in that the inductive component 1 is connected with the constant voltage source 13, that is to say the constant voltage $U_K$ is applied to the conductive component 1 and a current I with a current strength that is dependent on the constant voltage $U_K$ and with a high increase or rise rate dI/dt flows through the inductive component 1.

At the time point t2, the current threshold value $I_S$ is reached by the current I; the inductive component 1, however, remains connected with the constant voltage source 13, and thereby is further subjected to or acted on by the constant voltage $U_K$.

At the time point t3, the PWM is activated by the control unit 6. The constant voltage $U_K$ also remains applied to the inductive component 1 from the time point t3 until the time point t4, and a current I with a current strength dependent on the constant voltage $U_K$ flows through the inductive component 1; the inductive component 1 thus remains connected with the constant voltage source 13 and is subjected to or acted on by the constant voltage $U_K$ during the entire "capture phase".

At the time point t4 (after completion or lapse of the "capture phase" provided for the sure "capture" of the armature of the inductive component 1), on the one hand the inductive component 1 is connected with the supply voltage source 14 and thereby is acted on by the supply voltage $U_B$, that is to say, as of the time point t4, the supply voltage $U_B$ is applied to the inductive component 1 (end of the first phase of the current supply phase, beginning of the second phase of the current supply phase) and a current I with a current strength dependent on the supply voltage $U_B$ flows through the inductive component 1; on the other hand the current I through the inductive component 1 is reduced from the current threshold value $I_S$ (capture current) to the holding current $I_H$.

From the time point t4 on, the time progressions of the voltage U on the coil of the inductive component 1 (FIG. 3A), of the current I through the inductive component 1 (FIG. 3B), and of the pulse width modulation signal $S_{PWM}$ (FIG. 3C) correspond to the time progressions described according to FIG. 2.

According to a second example embodiment, the inductive component 1 is supplied with a battery voltage provided by a battery 14 as a supply voltage $U_B$ of, for example, 24 V. As an alternative voltage source, there is provided a constant voltage source 13, which makes available a constant voltage $U_K$ of, for example, 80 V. A capture current $I_S$ of 15 A and a holding current $I_H$ of 10 A is allocated to the inductive component 1. The inductive component 1 is acted on by the constant voltage $U_K$ during the complete capture phase (that is to say from the time point t1 until the time point t4).

What is claimed is:

1. Method for specifying a current flowing through an inductive component (1) during a current supply chase (ΔtB) consisting of a higher-current period in which the current is to be transitioned to and maintained at a higher nominal average current value and a subsequent lower-current period in which the current is to be transitioned to and maintained at a lower nominal average current value that is lower than the higher nominal average current value, wherein the inductive component (1) is acted on during the current supply phase (ΔtB) by a voltage, which is selected to be greater during a voltage-related first phase (Δt2) of the current supply phase (ΔtB) than during a subsequent voltage-related second phase (Δt3–Δt6) of the current supply phase (ΔtB), characterized in that, the inductive component (1) is acted on exclusively by a constant voltage ($U_K$) generated by a constant voltage source (13) during the voltage-related first phase (Δt2) of the current supply phase (ΔtB), and is acted on exclusively by a supply voltage ($U_B$) during the voltage-related second phase (Δt3–Δt6) of the current supply phase (ΔtB), and wherein the voltage-related first chase takes place exclusively during the higher-current period and not during the lower-current period.

2. Method according to claim 1, characterized in that the switching-over from the constant voltage ($U_K$) to the supply voltage is carried out by means of a first switch-over element (7) connected with the inductive component (1) and a second switch-over element (8) that is circuit-connected in series with the first switch-over element (7) and connected with the constant voltage source (13).

3. Method according to claim 1, characterized in that the inductive component (1) is acted on by the constant voltage ($U_K$) at least until reaching of a current threshold value ($I_S$) associated with the higher nominal average current value by the current (I) that flows through the inductive component (1) after the activation of the current supply phase (ΔtB).

4. Method according to claim 3, characterized in that the current (I) through the inductive component (1) is detected as a measured voltage ($U_M$) by a measuring resistor (2), and in that the reaching of the current threshold value ($I_S$) is detected by means of the measuring resistor (2).

5. Method according to claim 1, characterized in that the current strength of the current (I) flowing through the inductive component (1) is reduced from a first current value ($I_S$) associated with the higher nominal average current value to a second current value ($I_H$) associated with the lower nominal average current value during the voltage-related second phase (Δt3–Δt6) of the current supply phase (ΔtB).

6. Method according to claim 5, characterized in that the current strength of the current (I) flowing through the inductive component (1) is reduced with a prescribed time characteristic behavior.

7. Method according to claim 6, characterized in that the current strength of the current (I) flowing through the inductive component (1) is reduced in a smoothly gliding fashion.

8. Method according to claim 1, characterized in that the time progression of the current (I) flowing through the inductive component (1) is prescribed by a switching element (4) connected with the inductive component (1).

9. Method according to claim 8, characterized in that the switching element (4) is activated by means of a pulse width modulation (PWM) during the second phase ($\Delta t3$–$\Delta t6$) of the current supply phase ($\Delta tB$).

10. Method according to claim 9, characterized in that the inductive component (1) is acted on by the constant voltage ($U_K$) until a point of reaching a current threshold value ($I_S$) associated with the higher nominal average current value, and in that the pulse width modulation (PWM) is activated only after a prescribed time interval ($\Delta t3$) after a switch-over time point (t2) of the a switch-over from the constant voltage ($U_K$) to the supply voltage ($U_S$).

11. Method according to claim 9, characterized in that the current strength of the current (I) flowing through the inductive component (1) is reduced by step-wise variation of the pulse duty ratio of the pulse width modulation (PWM).

12. Method according to claim 1, characterized in that the activation and deactivation of the current supply phase ($\Delta tB$) is carried out by a control unit (6).

13. Method according to claim 12, characterized in that, in connection with the deactivation of the current supply phase ($\Delta tB$), a switch-off element (11) arranged between the inductive component (1) and a connection of a supply voltage source (14) which provides the supply voltage ($U_B$) is switched to a highly resistive state by the control unit (6).

14. Method according to claim 12, characterized in that, in connection with the deactivation of the current supply phase ($\Delta tB$), a switch-off element (11) arranged between the inductive component (1) and a connection of a supply voltage source (14) which provides the supply voltage ($U_B$) is opened by the control unit (6), and in that a back-feeding of energy stored in the inductive component (1) back into the constant voltage source (13) is carried out by a feedback element (12) arranged between the inductive component (1) and a connection of the constant voltage source (13).

15. Method according to claim 1, wherein the voltage-related first phase is limited in time to a portion of the higher-current period, and the voltage-related second phase corresponds in time to a remainder of the higher-current period and an entirety of the lower-current period.

16. Method according to claim 1, wherein the voltage-related first phase corresponds in time to the higher-current period, and the voltage-related second phase corresponds in time to the lower-current period.

* * * * *

UNITED STATES PATENT AND TRADEMARK OFFICE
CERTIFICATE OF CORRECTION

PATENT NO. : 6,721,158 B2
DATED : April 13, 2004
INVENTOR(S) : Heinke

It is certified that error appears in the above-identified patent and that said Letters Patent is hereby corrected as shown below:

Column 5,
Line 5, after "signal", replace "$S_{An}$" by -- $S_{AN}$ --;

Column 6,
Line 24, after "interval", replace "t6)" by -- $\Delta t6$) --;
Line 27, after "signal", replace "$S_{AM}$" by -- $S_{AN}$ --;

Column 7,
Line 38, after "value", replace "$I_s$" by -- $I_S$ --;

Column 8,
Line 18, after "supply", replace "chase" by -- phase --;
Line 36, after "first", replace "chase" by -- phase --;

Column 9,
Line 19, after "of", delete "the";
Line 20, after "voltage", replace "($U_S$)" by -- ($U_B$) --.

Signed and Sealed this

Thirtieth Day of November, 2004

JON W. DUDAS
*Director of the United States Patent and Trademark Office*